United States Patent [19]

Morgan

[11] 4,300,237

[45] Nov. 10, 1981

[54] SINGLE SIDEBAND MODULATION

[76] Inventor: Harvey L. Morgan, 8804 Graywood Dr., Dallas, Tex. 75231

[21] Appl. No.: 838,542

[22] Filed: Oct. 3, 1977

[51] Int. Cl.³ .............................................. H04B 1/68
[52] U.S. Cl. .................................... 455/109; 332/44; 455/47
[58] Field of Search .................... 332/45, 44; 325/137, 325/49, 50, 138, 419; 331/43; 455/47, 109

[56] References Cited

U.S. PATENT DOCUMENTS

| | | | |
|---|---|---|---|
| 2,705,775 | 4/1955 | Crosby | 332/45 |
| 2,761,105 | 8/1956 | Crosby | 455/109 |
| 2,900,459 | 8/1959 | Olive | 325/137 |
| 2,989,707 | 6/1961 | Kahn | 332/45 |
| 3,172,046 | 3/1965 | Paufve et al. | 325/419 |
| 3,460,041 | 8/1969 | Orwin et al. | 455/109 |
| 3,500,250 | 3/1970 | Frerking | 325/138 |
| 3,644,831 | 2/1972 | Latker et al. | 325/137 |
| 3,831,094 | 8/1974 | Stover | 325/159 |
| 4,131,850 | 12/1978 | Wilcox | 325/137 |
| 4,217,661 | 8/1980 | Kahn | 455/47 |

*Primary Examiner*—Joseph A. Orsino, Jr.
*Attorney, Agent, or Firm*—Kenneth R. Glaser

[57] ABSTRACT

A system for single sideband modulation, and a method implemented by the system. The system includes a double sideband, suppressed carrier modulator and a phase locked loop circuit receiving the output of the modulator and tuned to lock to one of the sidebands of the modulator output. The phase locked loop circuit produces an output having a constant amplitude, but otherwise tracking the signal contained in the one sideband. The output of the phase locked loop is processed by an amplifier having a controllable gain. Open and closed loop circuits are provided for deriving the amplitude of the signal contained in the one sideband. The latter amplitude is imparted to the output of the phase locked loop by using the signal amplitude to control the gain of the amplifier.

4 Claims, 3 Drawing Figures

SINGLE SIDEBAND MODULATION

BACKGROUND OF THE INVENTION

This invention relates to a system and method for single sideband modulation.

Single sideband radio transmission requires half the bandwidth of double sideband transmission, and is therefore economically attractive. However, neither of the two existing approaches to single sideband modulation are entirely satisfactory.

The "filter method" of modulation first uses a balanced modulator to produce double sideband, suppressed carrier modulation. The resulting signal is then filtered to pass only one of the two sidebands. This requires filters with a high rate of attenuation with frequency, if low frequency components of the modulating signal are to be preserved. Such filters are quite expensive.

The phasing method of single sideband modulation uses a trigonometric relationship, wherein quadrature components of the modulating signal and carrier are developed. One quadrature component of the modulating signal modulates a quadrature component of the carrier, to produce a first double sideband, suppressed carrier modulated output. The other quadrature component of the modulating signal modulates the second quadrature component of the carrier frequency to produce a second double sideband, suppressed carrier modulated output. The two double sideband outputs are then subtracted or added to produce the upper or lower sideband. To produce the quadrature components of the modulating signal requires precise, expensive networks. These networks do not produce an exact quadrature (90°) phase shift over a wide bandwidth; therefore, they do not precisely balance out the unwanted sideband. Both this method and the filter method have substantial shortcomings as regards low frequency response and achieveable bandwidth.

SUMMARY OF THE INVENTION

In accordance with the present invention, there is provided a system for implementing the following method of single sideband modulation. First, there is generated a double sideband, suppressed carrier modulated signal. Then a substantially constant amplitude signal is generated, phase locked to one sideband of the supresssed carrier modulated signal. This is accomplished in the system of the invention by means of a phase locked loop. The amplitude of the signal contained in the one sideband is derived; then the phase locked signal is processed to control its amplitude in correspondence with the derived amplitude.

In a preferred embodiment, the constant amplitude signal generated by a phase locked loop circuit is input to a gain controlled amplifier. In a closed loop embodiment, the output of the amplifier is demodulated, and the gain of the amplifier is controlled by a signal proportional to the difference between the absolute values of the demodulated amplifier output and the modulating signal input to the system.

In an open loop embodiment, the gain of the amplifier is controlled by a signal proportional to the integral of the absolute value of the modulating signal.

Advantages of the present invention lie both in the areas of performance and cost. The process preserves the modulating signal to both lower and higher frequency limits than the existing methods. Cost advantages flow from a capablility of implementing the system described herein using large scale semiconductor integration.

DESCRIPTION OF THE PREFERRED EMBODIMENT

Figure 1:
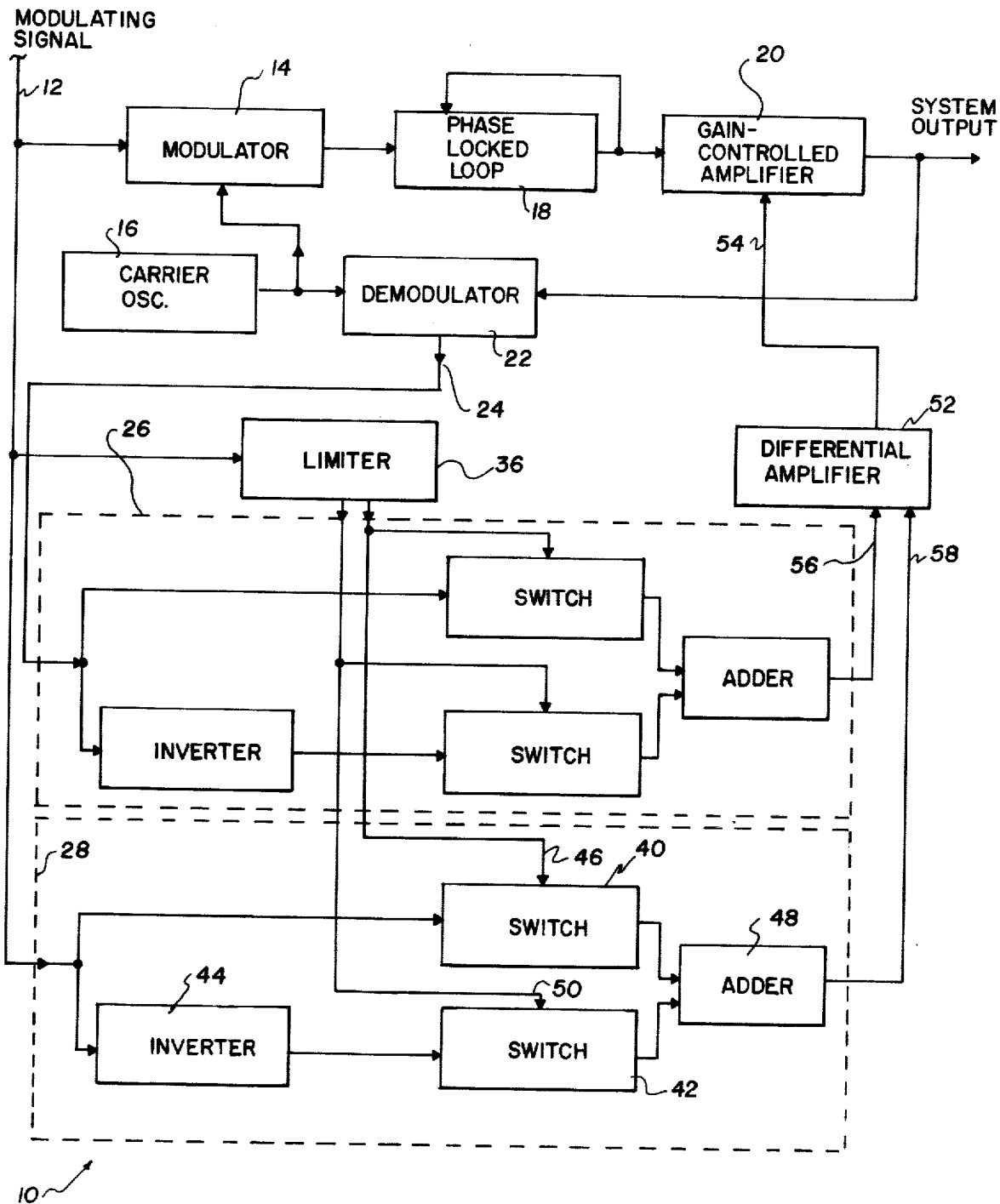
FIG. 1 is a block diagram of a single sideband modulation system according to the invention, of a closed loop design.

FIG. 1 shows a closed loop form of a modulation system according to the invention, indicated generally by the reference numeral 10. A modulating signal is introduced at system input 12 and is applied to the input of a balanced modulator 14. The other input to modulator 14 is a carrier signal from carrier oscillator 16.

The output of modulator 14 is a double sideband, suppressed carrier modulated signal. This is applied to phase locked loop circuit 18, which is tuned above or below the frequency of the carrier signal, so that circuit 18 locks to the upper or lower sideband of the modulator 14 output. Circuit 18 tracks the signal contained in the sideband to which it is tuned, selectively excluding the information in the other sideband. However, the output of circuit 18 is of constant amplitude. Accordingly, in order to generate a true single sideband modulated signal, the amplitude variations contained in the tuned sideband must be derived and introduced into the signal from circuit 18.

Introduction of the amplitude information into the signal from phase locked circuit 18 is performed by gain controlled amplifier 20. The gain of amplifier 20 is proportional to the signal applied to its control input 54. The first step in deriving the required amplitude information is to apply the output signal from gain controlled amplifier 20, along with the carrier signal from oscillator 16 to a demodulator 22. Demodulator 22 produces a single sideband, synchronously demodulated signal at its output 24.

Figure 2:
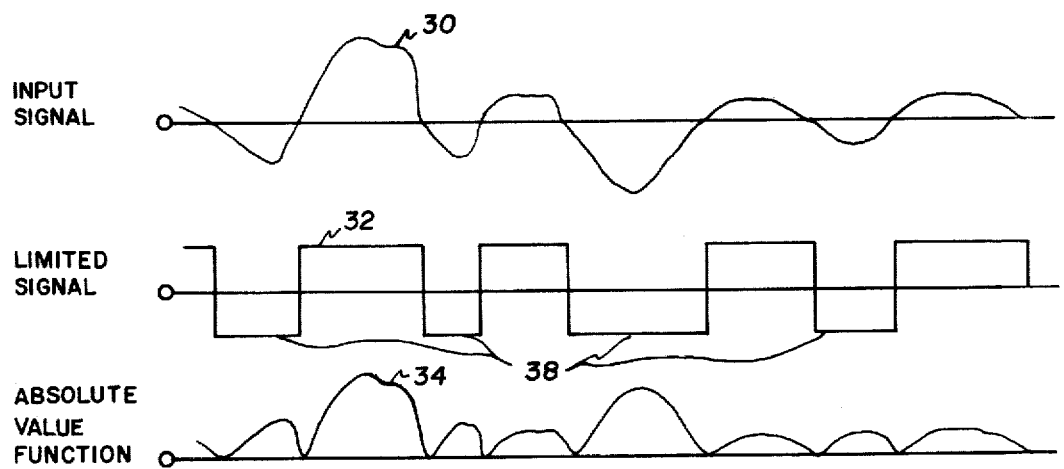
FIG. 2 shows examples of the time variation of waveforms in the system of FIG. 1.

The output 24 of demodulator 22 is applied to an absolute value circuit 26. The modulating signal from system input 12 is applied to a similar circuit 28. Waveforms important to the operation of circuits 27 and 28 are illustrated in FIG. 2. The waveform 30 represents an input to an absolute value circuit. The waveform 34 is the absolute value output derived from waveform 30. In waveform 34, all the excursions of waveform 30 about zero have been made positive. In a negative absolute value function the waveform 34 would be inverted. The waveform 32 is the output of a hard limiter circuit 36 (FIG. 1) having waveform 30 as its input. The waveform 32 switches between high and low limiting values at the zero crossings of the waveform 30.

It can be seen that waveform 34 may be derived from waveform 30 by inverting waveform 30 during the negative excursions 38 of the limited waveform 32. This is how the circuits 26 and 28 in FIG. 1 function. For example, in circuit 28, a switch 40 receives the system modulating signal as its input, while switch 42 receives the modulating signal inverted by inverter circuit 44. Limiter 36 provides to absolute value circuit 28 normal and inverted waveforms of a hard limited version of the modulating signal. The switching control 46 serves to close switch 40 during positive excursions of the modulating signal, thus passing these to an adder 48. Switching control 50 closes switch 42 during negative excursions of the modulating signal, passing an inverted and thereby positive version of the modulating signal to adder 48 during those periods. Thus adder 48 receives a positive version of the modulating signal both during the positive excursions of the modulating signals and during its negative excursions.

The absolute value of the modulating signal, produced by circuit 28, is connected to one input of a differential amplifier 52. To the other input of amplifier 52 is connected the absolute value of the output 24 of demodulator 22. The difference of these two absolute values is applied by differential amplifier 52 to the gain control 54 of amplifier 20.

The output of the modulation system 10 is the output of the gain controlled amplifier 20. The object of the closed loop in system 10 is to produce at the system output a signal having amplitude variations corresponding to a properly modulated single sideband signal. The function of demodulator 22 is to provide, at its output 24, a signal corresponding to that which would be generated by a receiver processing the system output. Ideally, the signal which is to be generated by such a receiver is the modulating signal introduced at point 12. This modulating signal is compared with the output 24, after taking absolute values, by the differential amplifier 52.

The gain of amplifier 52 and the sensitivity of gain control 54 are chosen so that a small difference between the inputs to amplifier 52 will produce a large change in the output of gain controlled amplifier 20. In addition, the phases of the loop are arranged so that when input 56 to differential amplifier 52 is larger than input 58 thereof, the effect on gain controlled amplifier 20 is such that it will tend to reduce the amplitude of the signal at input 56. The result is that input 56 of differential amplifier 52 will closely follow input 58 thereof. This means that the output 24 of demodulator 22 will be substantially the same as the modulating signal into the system, and thus, the system output will contain proper amplitude information for single sideband modulation.

Figure 3:
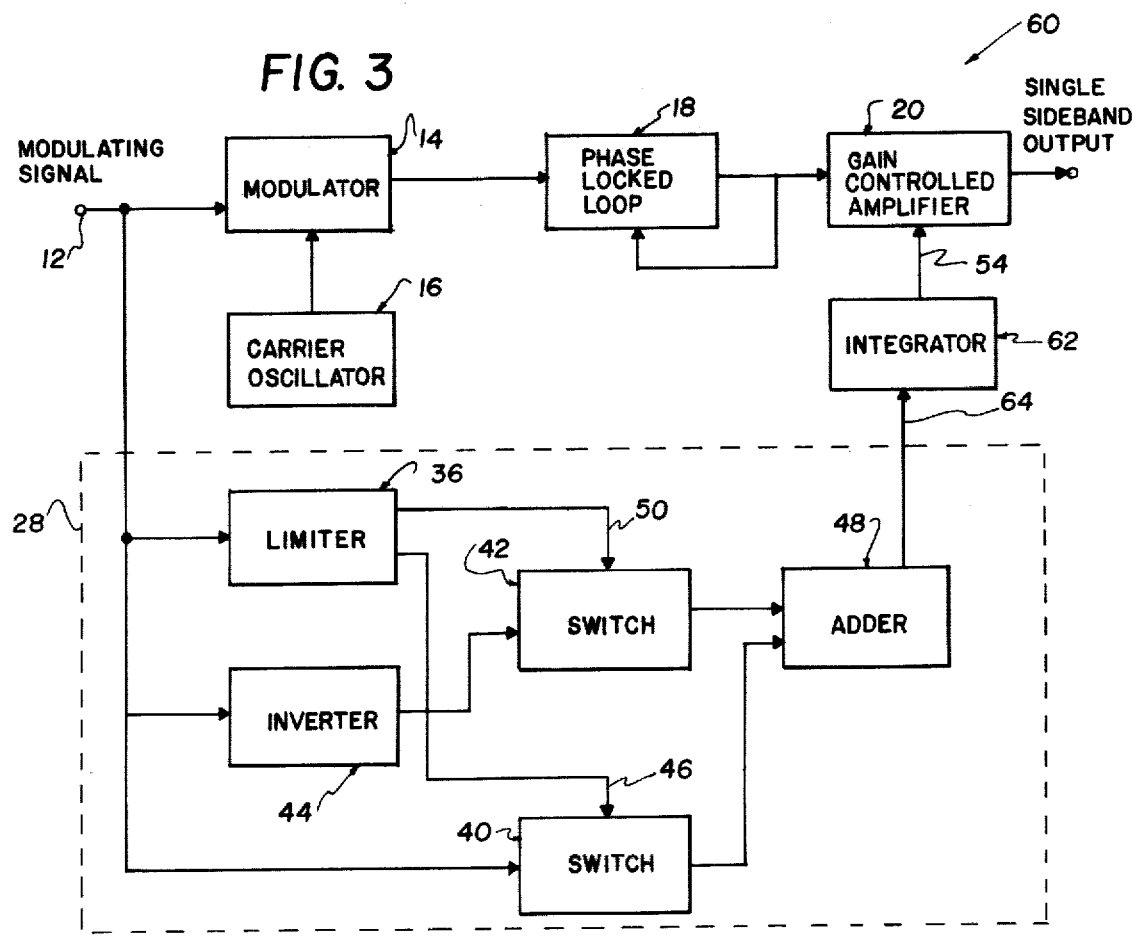
FIG. 3 is a block diagram of a single sideband modulation system according to the invention, using an open loop design.

FIG. 3 shows an alternate, open loop version of a modulating system according to the invention, generally referred to by the reference numeral 60. As in system 10, balanced modulator 14 performs a double sideband, suppressed carrier modulation of a signal from carrier oscillator 16 with respect to a modulating signal at system input 12. As before, the modulated signal is input to phase locked loop 18 and then to gain controlled amplifier 20. Also as before, the modulating signal 12 is input to an absolute value circuit 28. In system 60, the output 64 of absolute value circuit 28 is processed by an integrator 62. The integrator 62 may be a simple RC circuit commonly referred to as an integrator which is also known to provide a low pass filtering or smoothing function. The integrated signal is applied to gain control 54 of amplifier 20.

Thus in system 60, the amplitude information to be introduced into the output of the phase locked loop circuit 18 is derived by integrating the absolute value of the modulating signal. The integral is then used to control the gain of the phase locked loop output at amplifier 20. The modulation system 60 cannot be expected to exhibit the same degree of precision of modulation as system 10. However, system 60 is simpler, less costly, and provides very good low frequency response and wide modulating signal bandwidth.

Performance improvements are demonstrated by both the closed and open loop systems. The phase locked loop can track the modulating signal to the carrier frequency, so there is no fundamental limit to low frequency response with this method of single sideband modulation. Phase shift within the signal bandwidth is linear with frequency contributing greatly to signal quality. The upper limit of signal frequency is controllable by circuit parameters and can be many megahertz.

Although preferred embodiments of the invention have been described in detail it is to be understood that various changes, substitutions, and alterations can be made therein without departing from the spirit and scope of the invention as defined by the appended claims.

I claim:

1. A single sideband modulation system, comprising:
   a double sideband suppressed carrier modulator responsive to a carrier signal and a modulating signal,
   a phase locked loop circuit receiving the output of the modulator and tuned to one of the sidebands of the modulator output,
   wherein the phase locked loop circuit includes means for producing an output tracking the signal contained in said one sideband, except for the tracking output being of substantially constant amplitude, and
   further including amplifier means for applying to said loop circuit output a gain factor of controllable magnitude.

2. The system of claim 1,
   further including means for deriving the amplitude of the signal contained in said one sideband and for controlling said gain factor in proportion to the derived amplitude.

3. The system of claim 2, wherein the means for deriving includes
   means for demodulating the output of said amplifier means with respect to said carrier signal, and
   means for controlling said gain factor with a signal proportional to the difference between the absolute values of said modulating signal and the output of the demodulating means.

4. The system of claim 2, wherein the means for deriving includes means for controlling said gain factor with a signal proportional to the absolute value of said modulating signal.

* * * * *